(12) United States Patent
Lee et al.

(10) Patent No.: US 11,421,932 B2
(45) Date of Patent: Aug. 23, 2022

(54) DISPLAY ASSEMBLY AND REFRIGERATOR HAVING THE SAME

(71) Applicant: LG ELECTRONICS INC., Seoul (KR)

(72) Inventors: Wonjun Lee, Seoul (KR); Hongsik Kwon, Seoul (KR); Sooyeon Kim, Seoul (KR); Suhyeon Son, Seoul (KR)

(73) Assignee: LG ELECTRONICS INC., Seoul (KR)

(*) Notice: Subject to any disclaimer, the term of this patent is extended or adjusted under 35 U.S.C. 154(b) by 155 days.

(21) Appl. No.: 16/690,004

(22) Filed: Nov. 20, 2019

(65) Prior Publication Data

US 2020/0158418 A1 May 21, 2020

(30) Foreign Application Priority Data

Nov. 21, 2018 (KR) .................. 10-2018-0144270

(51) Int. Cl.
*F25D 23/02* (2006.01)
*H05B 45/10* (2020.01)
(Continued)

(52) U.S. Cl.
CPC ............ *F25D 23/028* (2013.01); *F25D 11/02* (2013.01); *G06F 3/04886* (2013.01);
(Continued)

(58) Field of Classification Search
CPC ............ G05B 15/02; G05B 2219/2642; G05B 19/0426; G05B 19/0425; G05B 19/0428; G05B 2219/23258; G05B 2219/25095; G05B 13/0265; G05B 19/042; G05B 19/124; G05B 2219/24015; G05B 2219/24024; G05B 2219/25085; G05B 2219/2614; G05B 2219/2654; G05B 2219/50333; H04B 10/116; H04B 5/0031; H04B 10/1149; H04B 17/318; H04B 10/11; H04B 10/1141; H04B 10/50; H04B 10/516; H04B 10/541; H04B 10/67; H04B 17/23; H04B 10/1143; H04B 10/506; H04B 10/54; H04B 10/60; H04B 3/14; H04L 2012/285; H04L 67/125; H04L 67/12; H04L 2012/2841; H04L 12/2809; H04L 12/282; H04L 12/2818; H04L 12/2823;
(Continued)

(56) References Cited

U.S. PATENT DOCUMENTS

2005/0011205 A1  1/2005  Holmes et al.
2010/0058792 A1  3/2010  Seo et al.
(Continued)

FOREIGN PATENT DOCUMENTS

KR   10-2016-0148037 A1   12/2016

*Primary Examiner* — Monica C King
(74) *Attorney, Agent, or Firm* — Dentons US LLP

(57) ABSTRACT

A display assembly including: a first light-emitting diode (LED) for displaying information regarding a temperature; at least one second LED for displaying information about a user-selectable menu; at least one third LED displaying information regarding a menu already selected by a user; at least one touch panel for detecting a touch from a user; and a controller configured to control the touch panel, the first LED, the at least one second LED, and at least one the third LED.

20 Claims, 5 Drawing Sheets

(51) Int. Cl.
*H05B 47/105* (2020.01)
*F25D 11/02* (2006.01)
*G06F 3/04886* (2022.01)
*G06F 3/0482* (2013.01)

(52) U.S. Cl.
CPC .......... *H05B 45/10* (2020.01); *H05B 47/105* (2020.01); *F25D 2327/001* (2013.01); *F25D 2700/12* (2013.01); *G06F 3/0482* (2013.01)

(58) Field of Classification Search
CPC ............. H04L 63/1416; H04L 63/1441; H04L 63/1491; H04L 67/10; H04L 67/325; H04L 12/2803; H04L 41/0816; H04L 41/0886; H04L 41/145; H04L 43/062; H04L 51/12; H04L 63/1408; H04L 63/1425; H04L 63/1433; H04L 67/02; H04L 12/40032; H04L 2012/2849; H04L 2012/4026; H04L 41/022; H04L 41/0806; H04L 41/082; H04L 63/083; H04L 67/1095; H04L 67/306; H04L 67/34; H04L 7/0075; H04L 12/12; H04L 12/1818; H04L 12/2807; H04L 12/2816; H04L 12/2825; H04L 12/2829; H04L 12/2832; H04L 12/2838; H04L 12/4625; H04L 1/0045; H04L 1/0061; H04L 1/0071; H04L 27/2602; H04L 41/0206; H04L 41/08; H04L 41/22; H04L 43/10; H04L 51/32; H04L 63/0428; H04L 63/0861; H04L 63/10; H04L 67/025; H04L 67/1006; H04L 67/28; H04L 67/42; H04L 7/0033; H04L 7/0091; F25D 2400/361; F25D 29/00; F25D 23/028; F25D 2500/06; F25D 2700/04; F25D 29/005; F25D 17/042; F25D 2331/803; F25D 2700/06; F25D 11/00; F25D 11/02; F25D 2317/0417; F25D 2323/021; F25D 2323/023; F25D 2323/121; F25D 2331/805; F25D 23/02; F25D 23/025; F25D 2400/28; F25D 2400/36; F25D 25/024; F25D 25/025; F25D 2600/02; F25D 2700/02; F25D 2700/12; F25D 2700/16; F25D 27/005; F25D 31/006; F25D 31/007; G06F 3/167; G06F 3/011; G06F 3/0482; G06F 3/04847; G06F 15/16; G06F 21/53; G06F 21/564; G06F 3/0488; G06F 3/04883; G06F 1/163; G06F 1/3231; G06F 1/3265; G06F 3/012; G06F 3/02; G06F 3/0304; G06F 3/04817; G06F 3/04842; G06F 3/04845; G06F 3/0487; G06F 40/106; G06F 40/137; G06F 8/34; G06F 8/41; G06F 8/76; G06F 9/45512; G06F 11/3013; G06F 11/32; G06F 11/325; G06F 16/00; G06F 16/27; G06F 16/51; G06F 16/58; G06F 16/9024; G06F 16/958; G06F 1/1626; G06F 1/1632; G06F 1/1686; G06F 1/1698; G06F 1/3215; G06F 1/3287; G06F 2009/45595; G06F 21/32; G06F 21/44; G06F 2200/1613; G06F 3/013; G06F 3/016; G06F 3/017; G06F 3/0202; G06F 3/0346; G06F 3/0362; G06F 3/042; G06F 3/04886; G06F 3/14; G06F 3/1454; G06F 3/147; G06F 3/165; G06F 9/44505; G06F 9/45558

See application file for complete search history.

(56) References Cited

U.S. PATENT DOCUMENTS

| | | | |
|---|---|---|---|
| 2011/0209493 | A1 | 9/2011 | Schenk et al. |
| 2017/0039511 | A1* | 2/2017 | Corona ................. G06Q 10/087 |
| 2018/0093814 | A1* | 4/2018 | Espinosa .................. A23L 3/28 |
| 2018/0239319 | A1* | 8/2018 | Abdoo ................. G05B 19/042 |
| 2018/0266751 | A1* | 9/2018 | Lim ...................... F25D 23/028 |

* cited by examiner

DISPLAY ASSEMBLY AND REFRIGERATOR HAVING THE SAME

CROSS-REFERENCE TO RELATED APPLICATION

This application claims the benefit of priority to Korean Patent Application No. 10-2018-0144270, filed on Nov. 21, 2018, with the Korean Intellectual Property Office, the entirety of which is incorporated herein by reference.

BACKGROUND

1. Field

The present disclosure relates to a display assembly and a refrigerator including the same, and more particularly, to a display assembly that may be easily manipulated by a user, and a refrigerator including the same.

2. Discussion of the Related Art

A refrigerator is an apparatus that may be used to freeze or refrigerate food. The refrigerator typically includes a casing having a storage compartment defined therein divided into a freezing compartment and a refrigerating compartment, and a refrigeration cycle apparatus including a compressor, a condenser, an evaporator, and an expansion valve. The refrigeration cycle apparatus is configured to lower a temperature of the freezing compartment and the refrigerating compartment.

The casing is equipped with a door to open and close the freezing compartment and the refrigerating compartment. In the refrigerator having such a configuration, the compressor compresses a low-temperature low-pressure gaseous refrigerant into a high temperature and high pressure state. Then, the compressed high-temperature high-pressure gaseous refrigerant is cooled and condensed as it passes through the condenser, and then become a high-pressure liquid state. As the refrigerant in the high-pressure liquid state passes through the expansion valve, its temperature and pressure are lowered. Then, the refrigerant turns into a low temperature low pressure gas state by the evaporator to take heat from surroundings and cool surrounding air. This refrigerating cycle may perform the cooling operation.

Various functions are applied to the refrigerator. Thus, it is important for the user to readily understand and use the various functions.

SUMMARY

The present disclosure solves the above-mentioned problems.

One purpose purpose of the present disclosure is to provide a display assembly that is intuitively recognized by the user, and easily manipulated by the user, and provide a refrigerator including the same.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

In one aspect, a display assembly in accordance with an embodiment of the present disclosure may include an LED display which achieves usability similar to that of an LCD display, thereby improving user convenience.

In another aspect, a display assembly in accordance with an embodiment of the present disclosure may provide only a user selectable menu to the user, such that the user may easily recognize the provided menu.

In another aspect, a display assembly in accordance with an embodiment of the present disclosure may prevent unnecessary information from being exposed to the user based on the user's usage environment thereby to provide an environment where the user may easily obtain information.

In another aspect, the present disclosure provides a refrigerator including the display panel.

In another aspect of the present invention, a display assembly may include: a first light-emitting diode (LED) for displaying information regarding a temperature; at least one second LED for displaying information about a user-selectable menu; at least one third LED displaying information regarding a menu already selected by a user; at least one touch panel for detecting a touch from a user; and a controller configured to control the touch panel, the first LED, the at least one second LED, and at least one the third LED.

In one implementation of the display assembly, the controller may be configured such that when the first LED is activated, the at least one third LEDs is activated.

In one implementation of the display assembly, the controller may be configured such that when the first LED is activated, the at least one third LED is not activated, and such that when the third LED is activated, the first LED is not activated.

In one implementation of the display assembly, the controller may be configured such that information displayed on the at least one third LED includes a pictogram.

In one implementation of the display assembly, each touch panel may be disposed adjacent to each second LED, wherein each menu corresponding to each second LED is selected upon each touch panel adjacent to each second LED detecting user's touch, and then the selected menu is delivered to the controller.

In one implementation of the display assembly, the at least one third LED may be activated in a blinking manner.

In another aspect, a refrigerator may include: a storage compartment for storing food therein; a door for opening and closing the storage compartment; a door sensor for detecting an open and close state of the door; and a display assembly for displaying information about the refrigerator, wherein the display assembly includes: a first light-emitting diode (LED) for displaying information regarding a temperature; at least one second LED for displaying information about a user-selectable menu; at least one third LED displaying information regarding a menu already selected by a user; at least one touch panel for detecting a touch from a user; and a controller configured to control the touch panel, the first LED, the at least one second LED, and at least one the third LED.

In one implementation of the refrigerator, the controller may be configured such that when the door sensor detects that the door is open, the first LED and the at least one third LED are activated.

In one implementation of the refrigerator, the controller may be configured such that when the first LED is activated, the at least one third LED is not activated, and such that when the third LED is activated, the first LED is not activated.

In one implementation of the refrigerator, the controller may be configured such that when the first LED is activated, the at least one third LEDs is activated.

In one implementation of the refrigerator, the door may include a upper door and a lower door, wherein the door sensor detects an open or close state of the upper door, wherein the display assembly is disposed on the lower door.

Effects of the present disclosure are as follows but are not limited thereto.

In accordance with the present disclosure, the display assembly may be intuitively recognized by the user, and easily manipulated by the user. Further, the user may easily recognize the provided menu. Further, the user may easily obtain information.

BRIEF DESCRIPTION OF DRAWINGS

The accompanying drawings constitute a part of this specification and illustrate an embodiment of the present disclosure and together with the specification, explain the present disclosure.

DETAILED DESCRIPTIONS

Figure 1:
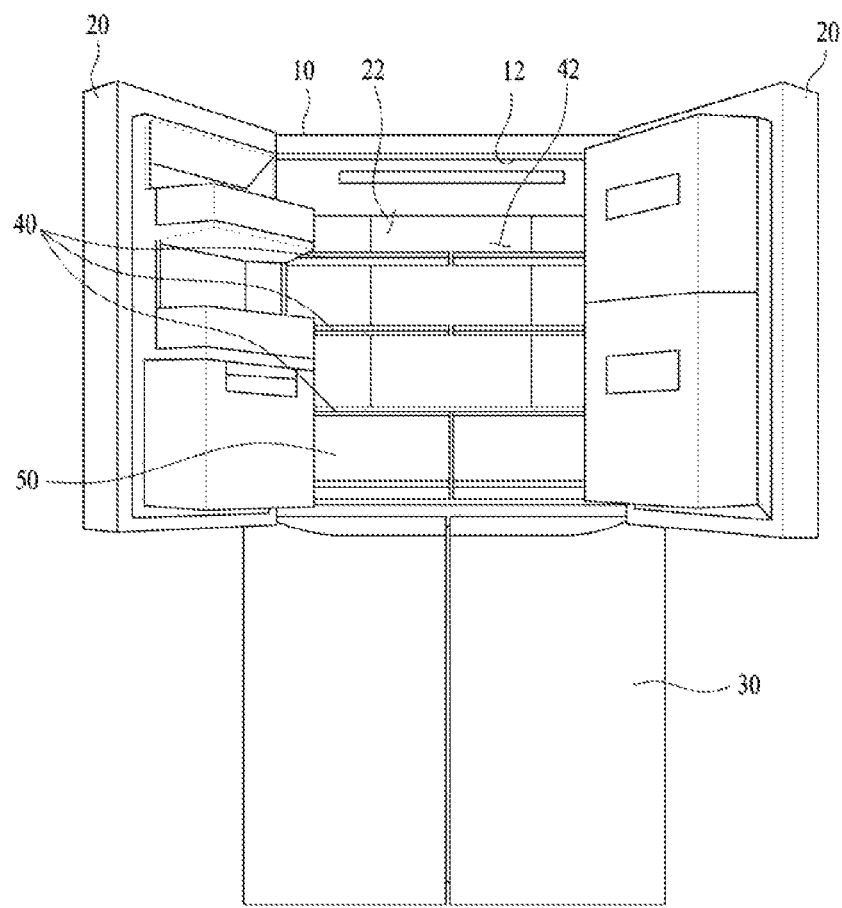
FIG. 1 is a front view of a refrigerator illustrating a state in which a door is open according to an embodiment of the present disclosure.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

In describing the components of the embodiment(s) of the present disclosure, terms such as first, second, A, B, (a), and (b) may be used. These terms are only for distinguishing the components from other components, and the nature, order or order of the components are not limited by the terms. If a component is described as being "connected", "coupled" or "connected" to another component, it should be understood that the component may be directly connected or connected to that other component, but having other components there between.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a front view of a refrigerator according to an embodiment of the present disclosure. In FIG. 1, the door of the refrigerator is shown as open.

A refrigerator according to an embodiment of the present disclosure may include a top mount-type refrigerator in which a freezing compartment and a refrigerating compartment as a storage compartment for storing food therein are arranged vertically such that the freezing compartment is disposed above the refrigerating compartment, a bottom mount-type refrigerator in which a freezing compartment and a refrigerating compartment are arranged vertically such that the freezing compartment is disposed below the refrigerating compartment, or a side-by-side type refrigerator in which the freezing compartment and the refrigerating compartment are arranged horizontally.

In the present embodiment, the present disclosure will be described for convenience of description, based on a bottom freezer-type refrigerator in which the freezing compartment and the refrigerating compartment are arranged vertically, and the freezing compartment is disposed below the refrigerating compartment, such as shown in FIG. 1.

A cabinet of the refrigerator may include an outer casing 10 defining or forming an overall appearance, and an inner casing 12 defining or forming a storage compartment 22 therein for storing food or other items therein. A predetermined space may be defined or formed between the outer casing 10 and the inner casing 12 so that cold air may circulate through the predetermined space. In one example, an insulation member may be formed between the outer casing 10 and the inner casing 12 so that air in the storage compartment 22 may be kept relatively cold as compared to an outer air (e.g., air outside the refrigerator).

In addition, a machine room (not shown) located in the space between the outer casing 10 and the inner casing 12 may contain a refrigerant cycle apparatus which circulates the refrigerant to generate cold air. The refrigerant cycle apparatus may be used to maintain freshness of foods stored in the refrigerator storage compartment. The refrigerant cycle apparatus includes a compressor for compressing a refrigerant, an evaporator (not shown) for converting a liquid refrigerant into a gaseous phase such that heat exchange occurs.

The refrigerator may have doors 20 and 30 for opening and closing the storage compartment. In this connection, the doors may include a freezing compartment door 30 and a refrigerating compartment door 20. Each door may be pivotally provided at one edge of the cabinet of the refrigerator via a hinge. Each of the freezing compartment door 30 and the refrigerating compartment door 20 may have a plurality of sub doors. That is, as shown in FIG. 1, each of the refrigerating compartment door 20 and the freezing compartment door 30 may be configured such that two sub doors are pivotally installed at both edges (e.g., right and left sides) of the cabinet of the refrigerator via hinges respectively.

A foam material may fill the space between the outer casing 10 and the inner casing 12 so that the outside and the storage compartment 22 may be thermally insulated from each other.

The storage compartment 22 may be defined by the inner casing 12 and the door 20 in an insulated manner from the outside of the refrigerator. The storage compartment 22 may be isolated from the outside of the refrigerator when the door 20 is closed. In other words, the storage compartment 22 may be defined by an insulation wall as the door 20 and an insulation wall as the casings 10 and 12 in an insulated manner from the outside of the refrigerator.

The cold air supplied from the machine room may flow throughout the storage compartment 22, so that the food stored in the storage compartment 22 may be kept at a low or desired temperature.

The storage compartment 22 may include a shelf 40 on which the food may be disposed. In this connection, a plurality of shelves 40 may be arranged vertically. The shelf 40 may fully or partially partition the interior of the storage compartment vertically.

The storage compartment 22 may include a drawer 50 that may be retracted or extended from the storage compartment 22. In one example, left and right side drawers 40 may be arranged in the storage compartment 22. The user may open a left door of the storage compartment 22 to access the left drawer. The user may open a right door of the storage compartment 22 to access the right drawer. Such configuration is an energy saver.

The storage compartment 22 may be divided into a first sub space located above a lowest shelf 40, and a second sub space defined in the drawer 50.

The cold air may flow between the freezing and refrigerating compartments. The cold may freely flow in each of the freezing and refrigerating compartments. The cold air may freely flow between divided sub spaces in each of the freezing and refrigerating compartments. For example, the cold air in the first space located above the lowest shelf 40 may flow into the second sub space defined in the drawer 50.

The display assembly which provides the user with information about an interior state of the refrigerator and allows the user to input a command thereto may be located on a top edge of the door 30 but is not limited to any particular location. The top edge of the door 30 may be a surface that is parallel to the ground. In other words, the user may access the display assembly on the top edge of the door 30 while the door 20 is opened. Further, when both of the door 20 and the door 30 are closed together, the display assembly is not exposed to the user. More particularly, for example, the door 20 may cover or block access to the display assembly located on the top edge of the door 30 when the door 20 is closed.

In another example, the display assembly may be installed in other positions than the top edge of the door 30. The display assembly may be placed inside the storage compartment 22 and may be placed in various positions on front faces of the doors 20 and 30.

Figure 2:
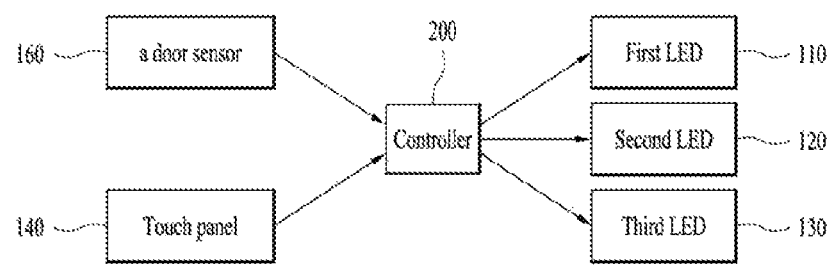
FIG. 2 is a block diagram of a refrigerator according to an embodiment of the present disclosure.
Figure 3:
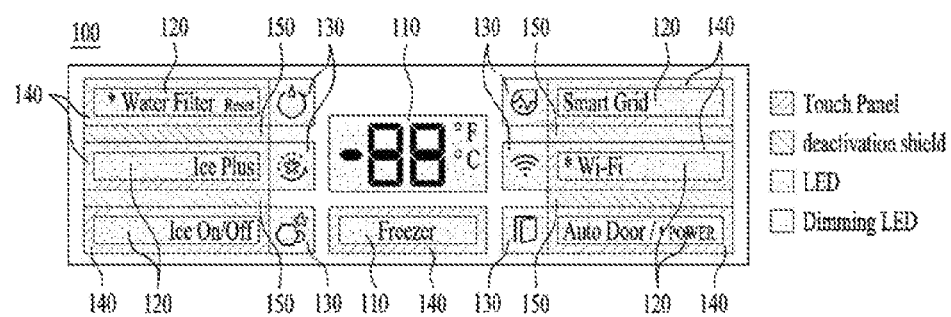
FIG. 3 is a diagram illustrating a configuration of a display panel for a refrigerator according to an embodiment of the present disclosure.

FIG. 2 is a block diagram of a refrigerator according to an embodiment of the present disclosure. FIG. 3 is a diagram illustrating a configuration of a display panel or assembly according to an embodiment of the present disclosure.

Referring to FIG. 2 and FIG. 3, the refrigerator may include a door sensor 160 for detecting opened and closed states of each of the doors 20 and 30. The door sensor 160 may detect whether each of the doors 20 and 30 is opened or closed.

The display panel 100 may include a touch panel 140 to operate via a user's touch (display panel 100 controls are not limited to touch type controls, and may be any input generating device to facilitate input of control instructions by a user). The touch panel 140 may constitute a portion of the display assembly 100 and may be positioned around a menu for user selection. Therefore, when the user touches a location adjacent to the menu, the touch panel 140 recognizes the touch and transmits information to a controller 200 or processor that the user selected the corresponding menu. The controller 200 is capable of executing the various tasks and processes described herein. See, e.g., FIG. 3.

In one example, a plurality of the touch panels 140 may be disposed in various places on the display assembly 100. The touch panels 140 may be separated from each other such that a corresponding touch panel detects the user touch thereof.

In an embodiment, the display assembly 100 may include a first LED 110 to display information regarding a temperature. The first LED 110 may display a set temperature of the storage compartment or a current temperature of the storage compartment. When the first LED 110 is activated, information about the temperature is displayed on the display assembly 100 so that the user may obtain the related information. The controller 200 may be configured to control the first LED 110 to be turned on or off, thereby selectively providing the related information to the user.

In one example the first LED 110 may indicate whether a currently selected storage compartment is a freezing compartment, a refrigerating compartment, or another type of compartment such as a vegetable compartment. When the first LED 110 is activated, the user may be provided with temperature information about which storage compartment is being displayed.

In one embodiment, the second LED 120 displays information regarding a user-selectable menu. The user-selectable menu may include, for example, a water filter reset, ice plus, ice on/off, smart grid, WiFi, and/or auto door/power.

For example, when the controller 200 activates the second LED 120 such that the second LED 120 is turned on, information about a menu selectable by the user may be provided to the user. For example, when the second LED 120 is activated by the controller 200, all menu information that may be commanded, controlled, selected, or operated by the user may be displayed.

In an embodiment, the third LED 130 may display information about a menu that the user has already selected. The third LED 130 may be composed of a pictogram, so that the user may easily recognize the relevant information.

A plurality of the third LEDs 130 may be provided (such as shown in FIG. 3). In this embodiment, the controller 200 may be configured to turn on some of the plurality of third LEDs 130 and turn off the other of the plurality of third LEDs 130. For example, the controller 200 may turn on the third LED 130 which displays the menu which the user has previously selected and is being used. The controller 200 may turn off the third LED 130 displaying a menu that is not in use by the user.

In one example, the third LED 130 may be blinkingly activated to inform another type information of the user. For example, when the third LED 130 is blinking, this may indicate to the user that the menu needs to be set.

The third LED 130 may be disposed adjacent to a corresponding menu, and thus may indicate that the menu corresponding to the third LED 130 and the menu corresponding to the second LED 120 are related to each other. For example, as shown in FIG. 3, each of the third LEDs 130 may be disposed adjacent to each of the second LEDs 120 and may be located closer to the center of the display assembly 100 than the second LEDs 120.

The controller 200 may be configured to receive a signal about the user's contact from the touch panel 140 (again, the control is not limited to a touch panel 140). In addition, the controller 200 may be configured to turn on or off of one of the first LED 110, the second LED 120, the third LED 130, or some of the first LEDs 110, some of the second LEDs 120, or some of the third LEDs 130.

The controller 200 may be configured to activate some of the third LEDs 130 together while activating the first LED 110. In this connection, the user may obtain information provided from the first LED 110 and information provided from the third LED 130.

For example, when the controller 200 activates the first LED 110, the controller 200 may disable the third LED 130. On the other hand, the controller 200 may activate the third LED 130 but not the first LED 110. Since the information provided by the first LED 110 and the information provided by the third LED 130 are not simultaneously provided to the user, the user may obtain a small amount of information sequentially, so that the related information may be more easily recognized by the user.

A plurality of the touch panels 140 may be provided. When a user touch of each touch panel 140 adjacent to each menu is detected, the corresponding menu may be selected.

The touch panel 140 may be disposed outside the menu corresponding to the second LED 120. The touch panel 140 may has a strip-like shape but is not limited thereto. In another example, the touch panel 140 may have a square shape containing the menu corresponding to the second LED 120.

A deactivation shield 150 may be disposed between adjacent two of the plurality of touch panels 140 so that two touch panels 140 may be separated from each other via the deactivation shield 150. When the user touches a region between two menus, the deactivation shield 150 may deactivate the touch panel 140 that none of the two menus is selected. The deactivation shield 150 may be disposed between two touch panels 140 so that the touch panels 140 may not detect the touch when the user touches the region between the two touch panels 140. Such configuration reduces user input error.

The first LED 110 may be disposed at the center portion of the display assembly 100. The third LEDs 130 may be disposed at the left and right sides to the first LED 110. The fourth LEDs 140 may be disposed at the outermost region.

FIG. 3 shows a display assembly that displays information about the freezing compartment. Thus, the first LED 110 indicates a "freezer". In another example, a display assembly displays information about the refrigerating compartment. Thus, the first LED 110 would indicate a "refrigerating chamber".

Figure 4:
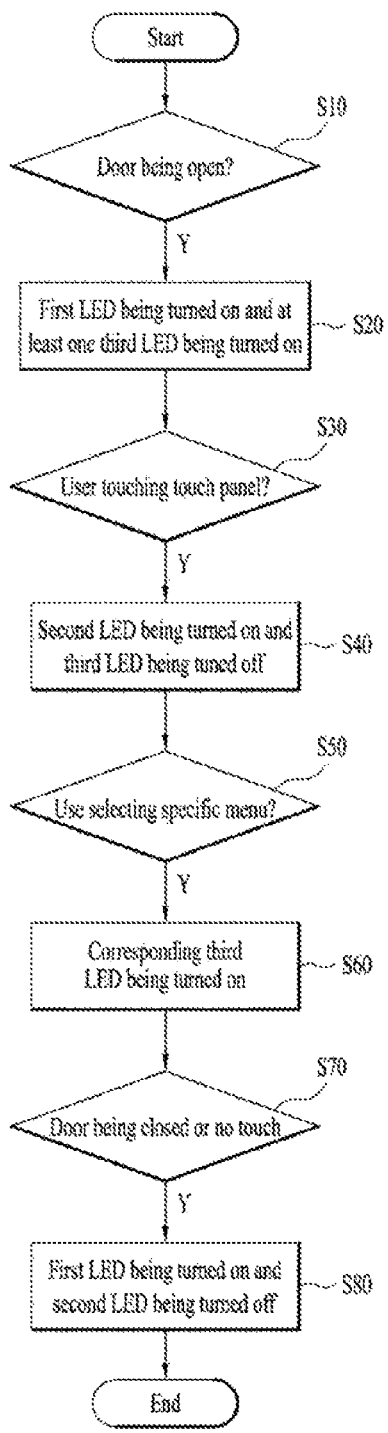
FIG. 4 is a control flow diagram for a display assembly of a refrigerator according to an embodiment of the present disclosure.
Figure 5:
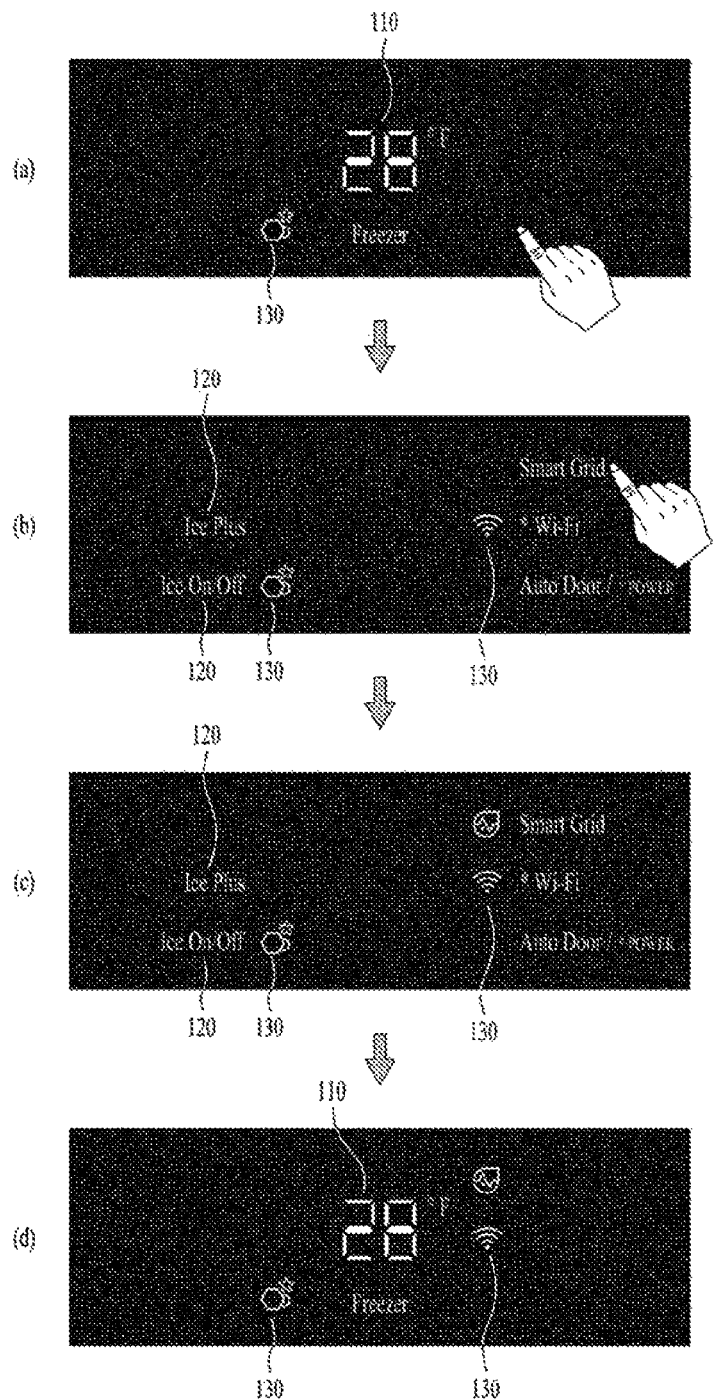
FIG. 5 is an implementation flow diagram for a display panel of a refrigerator according to an embodiment of the present disclosure.

FIG. 4 is a control flowchart for a display assembly of a refrigerator according to one embodiment. FIG. 5 is an implementation flowchart for a display panel of a refrigerator in accordance with one embodiment.

Referring to FIG. 4 and FIG. 5, the user opens the door 20 while the refrigerator is powered up and is operating.

The door sensor 160 is configured to detect whether the door 20 is open S10 or closed. When the door 20 is open, the display assembly 10 installed on the top edge of the door 30 or in another location may be exposed to the user. The user may check the information provided on the display assembly 10. The display assembly is not limited to being located in a location that is only exposed to the user when the door 20 is open.

When the door 20 detects that the door 20 is open, the first LED 110 and some of the third LEDs 130 may be activated. Accordingly, the user may check the information provided from the first LED 110 and some of the third LEDs 130.

The first LED 110 may allow the user to determine which type storage compartment the display assembly 100 provides information about (e.g., freezer, refrigerator, etc.), and to determine a current internal temperature of the corresponding storage compartment or a set temperature of the corresponding storage compartment.

While the first LED 110 is activated, the menu that the user has already selected and is being executed may be displayed on the third LED 130 S20. That is, the user may simultaneously recognize the information provided on the first LED 110 and the information provided on the third LED 130.

The information provided on the third LED 130 may be expressed in a form of an icon or pictogram, so that the user may easily grasp a meaning thereof. The invention is not limited to any particular expression or style of information provided on the third LED 130.

In FIG. 5a, for example, the user has already activated the ice on/off function, and the function is displayed together with information about the temperature.

In FIG. 5a, when the touch panel 140 detects that the user touches the touch panel 140 S30, the controller 200 may be configured to turn off the first LED 110, and turn on the second LED 120 S40.

In this connection, for example, a state in which some of the third LEDs 130 are turned on is maintained.

The user may not recognize the information provided on the first LED 110, but may recognize the information provided on some of the seconds LED 120 and some of the third LEDs 130. In this way, too much information is not provided to the user at one time, so the information provided on the display assembly 10 may be more easily recognized by the user.

As shown in FIG. 5b, the user may simultaneously check the information provided on some of the third LEDs 130 and the information provided on some of the second LEDs 120.

In other words, when the user is initially aware of the temperature of the storage compartment and touches another touch panel to change a menu, information about the menu that may be set or controlled by the user may be provided on the second LED 120 to the user.

As shown in FIG. 5b, the user may select some (e.g., less than all) of the menus corresponding to the second LEDs 120 S50. In this connection, each touch panel 140 located adjacent to each menu may detect a user's touch.

When the touch panel 140 adjacent to the smart grid menu detects that the user selects a smart grid menu, as shown in FIG. 5b, the controller 200 may be configured to determine that the user selected a command related to the smart grid and then command the refrigerator to perform a related function. Therefore, a function for performing the command is implemented in the refrigerator.

As shown in FIG. 5c, while performing the user-selected function, the controller 200 may be configured to activate the third LED 130 that displays the content of the corresponding menu S60. In this connection, the corresponding third LED 130 may be located adjacent to the second LED 120 displaying the corresponding menu. In FIG. 5c, another pictogram has been shown. The user may know that the corresponding function is currently being implemented based on the information displayed by the corresponding third LED 130.

When the door 20 is closed or when there is no touch on the touch panel 140 for a certain predetermined time duration S70, the controller 200 may be configured to turn off the second LED 120 and turn on the first LED 110. That is, when the door sensor 160 detects that the door 20 is closed, this may be considered as a situation where it may not be necessary to provide a user with a selectable menu. In addition, when the touch panel 140 does not detect the user touch for a certain predetermined period of time, this may be determined as a situation in which the user is no longer willing to select a menu, and there is no need to provide the user with a selectable menu.

Thus, the controller 200 may be configured to stop activating the second LED 120 to stop providing information about the user-selectable menu to the user. Instead, the display assembly 100 may display an initial screen which, for example, may provide the user with temperature information about the corresponding storage compartment.

In one example, while the first LED 110 is activated, the second LED 120 is not activated, but at least one the third LED 130 is still activated. In addition, while the second LED 120 is activated, the first LED 110 is not activated, but at least one the third LED 130 is still activated. Therefore, the user may continuously obtain information from the third LED 130 while the display assembly 10 is activated.

In one example, the third LED 130 may blink in order to inform the user of a specific alarm. In this connection, the specific alarm may be used to alert the user to select a specific function or to indicate that the specific function is abnormal.

The user may more easily recognize the information because the user is provided with the information from the first LED 110, the second LED 120, and the third LED 130 at the same time but the information from the first LED 110, the information from the second LED 120, and the information from the third LED 130 are sequentially displayed to the user.

Although the present disclosure has been described with reference to the drawings and embodiments as exemplified above, the present disclosure is not limited to the embodiments and the drawings disclosed herein. It is obvious that various modifications may be made thereto by a person skilled in the art within the scope of the present disclosure. In addition, it should be appreciated that effects to be achieved from configurations of the present disclosure as not expressly mentioned may be acknowledged.

What is claimed is:

1. A display assembly comprising:
a first light-emitting diode (LED) to display temperature-related information;
at least one second LED to display user-selectable menu information regarding a user-selectable menu to be selected by a user;
at least one third LED to display user-selected menu information regarding a menu already selected by the user;
at least one touch panel to detect a touch input from the user; and
a controller configured to control the touch panel, the first LED, the at least one second LED, and at least one the third LED,
wherein the controller is configured to activate the at least one third LED when the first LED is activated,
wherein each of the at least one third LED is disposed adjacent to a corresponding menu, such that it indicates that the menu corresponding to the third LED and the menu corresponding to the second LED are related to each other, and
wherein each of the at least one third LED is disposed adjacent to each of the at least one second LED and located closer to the center of the display assembly than each of the at least one second LED.

2. The display assembly of claim 1, wherein the controller is configured to control the first LED and the at least one third LED such that:
when the first LED is activated, the at least one third LED is not activated, and
when the at least one third LED is activated, the first LED is not activated.

3. The display assembly of claim 1, wherein the controller is configured to control the at least one third LED such that the user-selected menu information displayed on the at least one third LED comprises a pictogram.

4. The display assembly of claim 1, wherein each of the at least one touch panel is disposed adjacent to each of the at least one second LED, wherein each menu corresponding to each of the at least one second LED is selected upon each of the at least one touch panel adjacent to each of the at least one second LED detecting user's touch, and then the selected menu is transmitted to the controller.

5. The display assembly of claim 1, wherein the at least one third LED is activated in a blinking manner.

6. A refrigerator comprising:
a storage compartment;
a door to open and close the storage compartment;
a door sensor configured to detect an open and close state of the door, the open state being when the door is open and the close state being when the door is closed; and
a display assembly configured to display information about the refrigerator,
wherein the display assembly comprises:
a first light-emitting diode (LED) to display temperature-related information;
at least one second LED to display user-selectable menu information regarding a user-selectable menu to be selected by a user;
at least one third LED to display user-selected menu information regarding a menu already selected by the user;
at least one touch panel to detect a touch input from the user; and
a controller configured to control the touch panel, the first LED, the at least one second LED, and at least one the third LED,
wherein the controller is configured to activate the at least one third LED when the first LED is activated,
wherein the first LED is disposed at the center portion of the display assembly,
wherein each of the at least one third LED is disposed at the left and right sides of the first LED, and
wherein each of the at least one second LED is disposed at the outermost region.

7. The refrigerator of claim 6, wherein the controller is configured to activate the first LED and the at least one third LED when the door sensor detects that the door is open.

8. The refrigerator of claim 6, wherein the controller is configured to control the first LED and the at least one third LED such that:
when the first LED is activated, the at least one third LED is not activated, and
when the third LED is activated, the first LED is not activated.

9. The refrigerator of claim 6, wherein the door comprises a upper door and a lower door,
wherein the door sensor is configured to detect the open and close state of the upper door,
wherein the display assembly is provided on the lower door.

10. The refrigerator of claim 9, wherein display assembly is provided on a top edge of the lower door.

11. The refrigerator of claim 10, wherein display assembly is not accessible to the user when the upper door of the refrigerator is closed.

12. The display assembly of claim 1, wherein a plurality of the touch panels are provided,
wherein when a user touch of each touch panel adjacent to each menu is detected, the controller determines that the corresponding menu are selected,
wherein the touch panel are disposed outside the menu corresponding to the second LED, and
wherein the touch panel has a strip-like shape.

13. The display assembly of claim 1, wherein a plurality of the touch panels are provided,
wherein deactivation shields are disposed between adjacent two of the plurality of touch panels so that two touch panels are separated from each other via the deactivation shields, and
wherein the deactivation shields are disposed between two touch panels so that the touch panels do not detect the touch when a user touches the region between the two touch panels.

14. The display assembly of claim 1, wherein the first LED is disposed at the center portion of the display assembly, and
wherein each of the at least one third LED is disposed at the left and right sides of the first LED, and
wherein each of the at least one second LED is disposed at the outermost region.

15. The refrigerator of claim 6, wherein each of the at least one third LED is disposed adjacent to a corresponding menu, such that it indicates that the menu corresponding to the each of the at least one third LED and the menu corresponding to each of the at least one second LED are related to each other, and
wherein each of the at least one third LED is disposed adjacent to each of the at least one second LED and located closer to the center of the display assembly than each of the at least one second LED.

16. The refrigerator of claim 6, wherein a plurality of the touch panels are provided,
wherein when a user touch of each touch panel adjacent to each menu is detected, the controller determines that the corresponding menu are selected,
wherein the touch panel are disposed outside the menu corresponding to the second LED, and
wherein the touch panel has a strip-like shape.

17. The refrigerator of claim 6, wherein a plurality of the touch panels are provided,
wherein deactivation shields are disposed between adjacent two of the plurality of touch panels so that two touch panels are separated from each other via the deactivation shields, and
wherein the deactivation shields are disposed between two touch panels so that the touch panels do not detect the touch when a user touches the region between the two touch panels.

18. The refrigerator of claim 6, wherein the first LED is disposed at the center portion of the display assembly, and
wherein each of the at least one third LED is disposed at the left and right sides of the first LED, and
wherein each of the at least one second LED is disposed at the outermost region.

19. A display assembly comprising:
a first light-emitting diode (LED) to display temperature-related information;
at least one second LED to display user-selectable menu information regarding a user-selectable menu to be selected by a user;
at least one third LED to display user-selected menu information regarding a menu already selected by the user;
at least one touch panel to detect a touch input from the user; and
a controller configured to control the touch panel, the first LED, the at least one second LED, and at least one the third LED,
wherein the controller is configured to activate the at least one third LED when the first LED is activated, and
wherein the first LED, the second LED and the third LED are operated independently.

20. The display assembly of claim 19, wherein the controller independently is configured to turn on or off of the first LED, the second LED and the third LED.

\* \* \* \* \*